(12) United States Patent
Kamath

(10) Patent No.: US 7,733,119 B1
(45) Date of Patent: Jun. 8, 2010

(54) SINGLE-RESISTOR STATIC PROGRAMMING CIRCUITS AND METHODS

(75) Inventor: Gautham Devendra Kamath, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 718 days.

(21) Appl. No.: 11/478,707

(22) Filed: Jun. 30, 2006

Related U.S. Application Data

(63) Continuation of application No. 10/116,324, filed on Apr. 3, 2002, now abandoned.

(51) Int. Cl.
*H03K 17/16* (2006.01)
(52) U.S. Cl. ....................................................... 326/30
(58) Field of Classification Search .................. 326/30, 326/82–87
See application file for complete search history.

(56) References Cited

U.S. PATENT DOCUMENTS

| 31,720 | A | * | 3/1861 | DeFreitas et al. | 261/104 |
| 4,833,472 | A | * | 5/1989 | Hannappel et al. | 341/142 |
| 6,307,490 | B1 | * | 10/2001 | Litfin et al. | 341/121 |
| 6,525,558 | B2 | * | 2/2003 | Kim et al. | 326/30 |

* cited by examiner

*Primary Examiner*—Rexford N Barnie
*Assistant Examiner*—Thienvu V Tran
(74) *Attorney, Agent, or Firm*—Thompson & Knight LLP; James J. Murphy

(57) ABSTRACT

Programming circuitry 200 includes a terminal 202 for coupling to a resistor having a resistance representing a corresponding programming state. Current control circuitry 204/205 selectively passes at least one exponentially weighted current through terminal 202. Detection Circuitry 201 then determines the resistance of the resistor from the at least one exponentially weighted current to determine the programming state.

1 Claim, 5 Drawing Sheets

US 7,733,119 B1

SINGLE-RESISTOR STATIC PROGRAMMING CIRCUITS AND METHODS

CROSS REFERENCE TO RELATED APPLICATIONS

This application for patent is a continuation of the following applications for patent: U.S. patent application Ser. No. 10/116,324, filed Apr. 3, 2002 now abandoned.

FIELD OF INVENTION

The present invention relates in general to integrated circuits and in particular, to single-resistor static programming circuits and methods.

BACKGROUND OF INVENTION

Many non-software-programmable integrated circuits are statically configurable. For example, a set of mode control pins may be individually coupled through external resistors to either the power supply voltage or ground. These voltages are then read and decoded at power on reset or another triggering event and the device sent into the corresponding operating mode. There may even be multiple levels of decoding, with the voltages at one set of pins determining the decoding of another set of pins during static configuration.

In conventional static programming schemes, the number of static configuration (mode select) pins or pads required is generally a function of the number of modes available—the more programmable modes available, the more pins required to make the selection. For example, if 4 (i.e., $2^2$) modes are available, then at least 2 pins are required for mode selection, while if 8 (i.e. $2^3$) modes are available, then at least 3 mode select pins are required, and so on. Hence, these conventional schemes are typically adequate if the number of available programmable modes is relatively small and/or the required pins are available yet are limited in the number of pins or pads which are available for configuration purposes.

Notwithstanding, when a large number of programmable modes are provided and/or in instances where the number of available pins is limited, conventional static programming techniques are inadequate. Hence, improved circuits and methods are needed to support statically configurable integrated circuits, especially those, which provide the end-user with a number of configuration options.

SUMMARY OF INVENTION

The principles of the present invention allow for integrated circuit to be statically programmed for a selected one of a plurality of available programming states using a single resistor. According to one embodiment of these principles, programming circuitry is disclosed which includes a terminal for selective coupling to a resistor having a resistance representing a corresponding programming state. Current control circuitry selectively passes at least one exponentially weighted current through the terminal. Associated circuitry then determines the resistance of the resistor on the exponentially weighted current and determines the programming state.

The principles of the present invention advantageously allow a single resistor and/or terminal to be used to program an integrated circuit to one of $2^N$ states. In the preferred embodiment, resistors are selected from a set of exponentially increasing resistor values, which allows the tolerances on those resistor values to be relaxed. In some embodiments, the external resistor is tied to either a high voltage rail (e.g., $V_{DD}$) or a low voltage rail (e.g., ground) allowing each resistor value to be used to program two corresponding states. In alternate embodiments, the internal resistor is coupled between two terminals on the integrated circuit and stepped current is passed there between to determine the resistor value.

BRIEF DESCRIPTION OF DRAWINGS

For a more complete understanding of the present invention, and the advantages thereof, reference is now made to the following descriptions taken in conjunction

DETAILED DESCRIPTION OF THE INVENTION

The principles of the present invention and their advantages are best understood by referring to the illustrated embodiment depicted in FIGS. 1-4 of the drawings, in which like numbers designate like parts.

Figure 1:
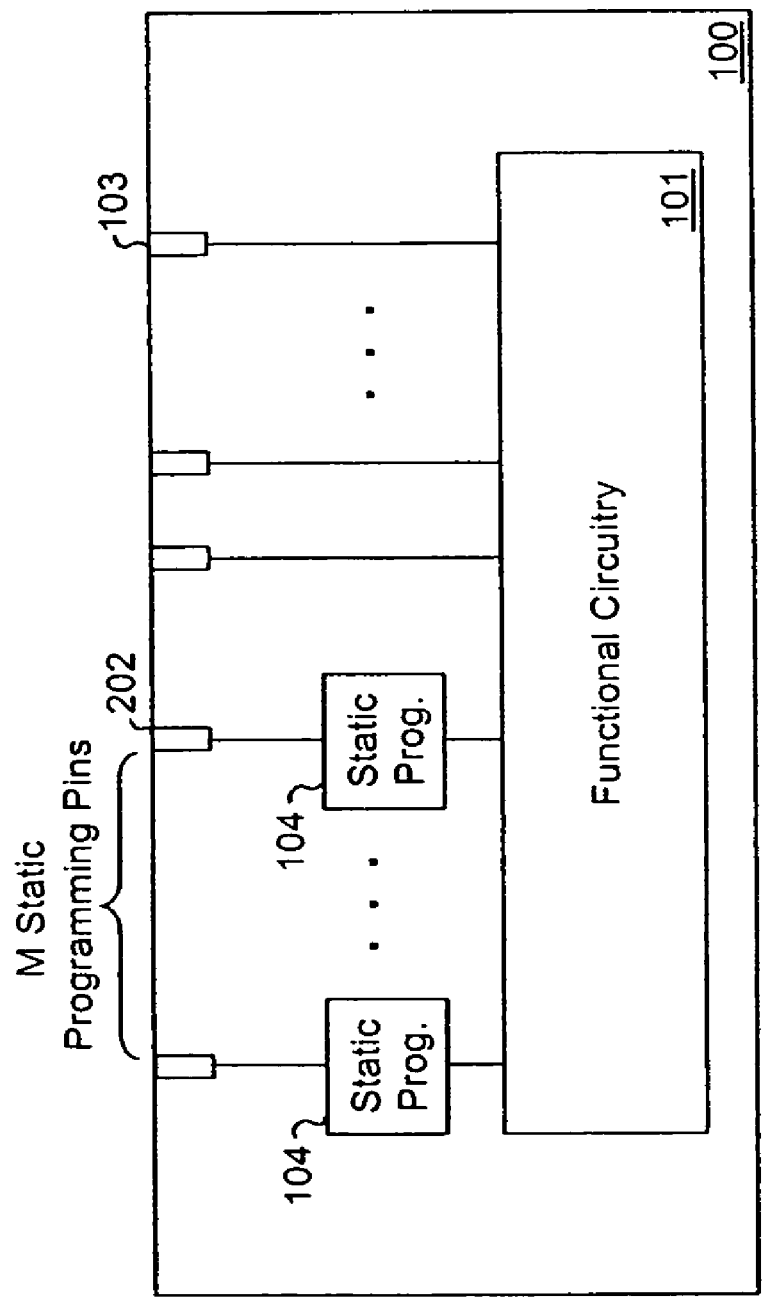
FIG. 1 is a high level functional block diagram of an integrated circuit (IC) embodying the principles of the present invention.

FIG. 1 is a high level functional block diagram of an integrated circuit (IC) 100 embodying the principles of the present invention. IC 100 is based on a functional circuit block 101 which could be any type of functional circuit block known in the art, although it preferably is one which is not programmable in software or firmware. Functional block 101 is associated with a corresponding number of pins or pads 103 for interconnection to external devices. A selected number M of these pins (pads) 103/202 are associated with static programming circuit blocks 104 which are described in detail below.

Figure 2:
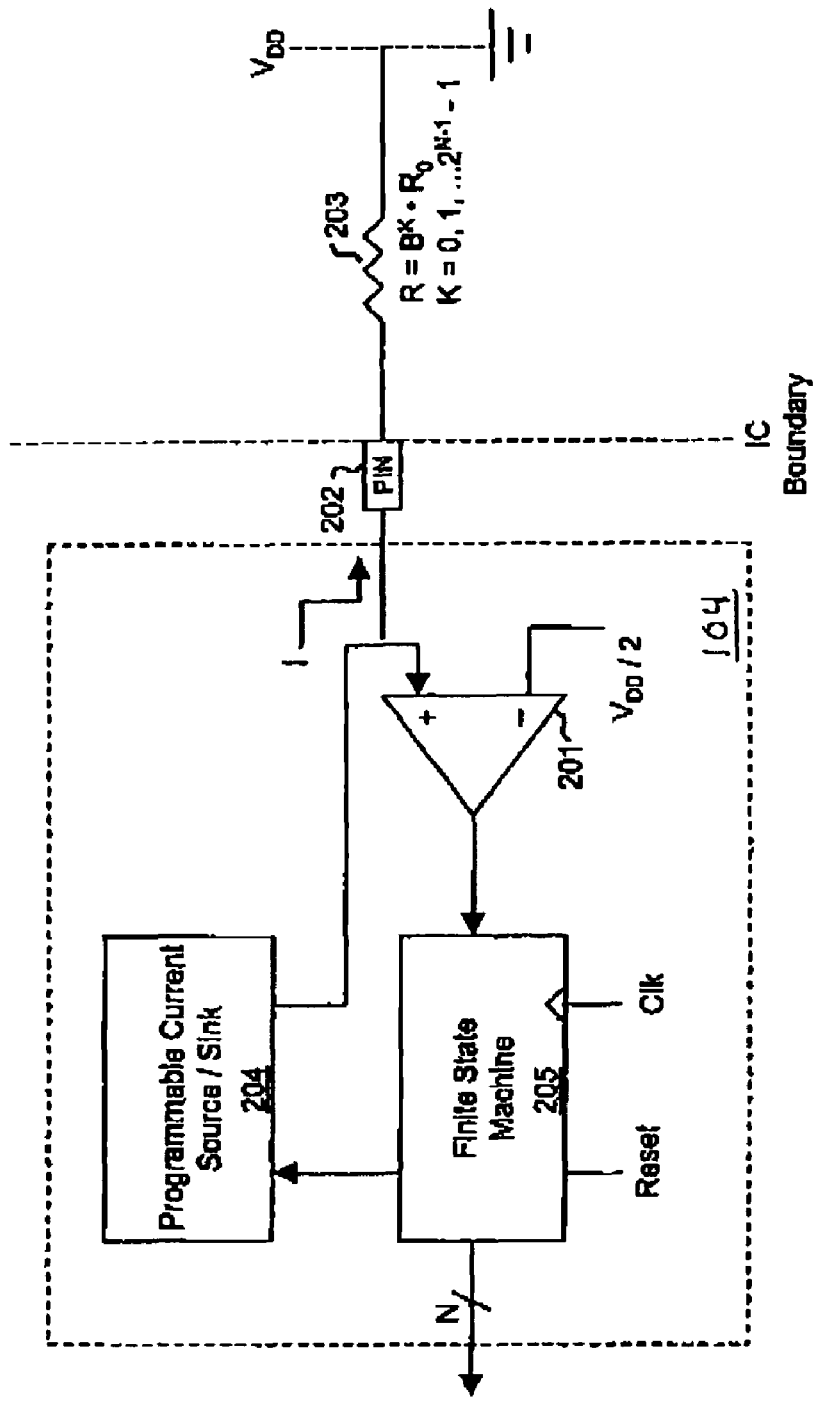
FIG. 2 illustrates static programming circuit block of FIG. 1 in further detail, along with an external programming resistor couple to a voltage rail.

FIG. 2 illustrates static programming circuit block 104 in further detail. In the illustrated embodiment, a selected comparator 201 is used compare a voltage at a selected static programming pin (pad) 202 against a reference voltage, in this example $V_{DD}/2$, where $V_{DD}$ is the power supply voltage. This voltage is generated by sinking and sourcing exponentially weighted currents through a single external resistor 203, tied to either $V_{DD}$ or ground, under the control of programmable current source/sink 204. Once the comparator trips, the value of the external resistor is known approximately from Ohm's Law. By knowing the value of the resistor and whether current is being sunk or sourced at the time the comparator trips, the programmed state is in turn determined.

In the illustrated embodiment, pin 202 can be used to program device 100 to any one of $2^N$ combinations. Preferably, since external resistor 203 can be tied to either $V_{DD}$ or ground, the value of the external resistor can take on any value in the set $B^K R_0$, where K=0, 1, . . . $2^{N-1}-1$, $R_0$ is the selected base resistance and the numerical factor B is greater than 1. Programmable current source/sink 204 then sources or sinks current in exponentially weighted steps of $i_0$, $Bi_0$, $B^2 i_0$, . . . $i_0 \cdot B$ raised to the power of $2^{N-1}-1$, where $i_0$ is the smallest current capable of triggering the comparator at the smallest value of K or approximately $V_{DD}/2 \cdot 1/R_0$. In the particular case where B=2, the current steps have a binary weighting.

Finite state machine 205 operating in response to clock CLK implements the current steps. Specifically, if $B^K R_0$ external resistor 203 is tied to $V_{DD}$, current is sunk by source/sink 204 in steps until the resulting voltage trips the comparator. The same process applies when $B^K R_0$ external resistor 203 is tied to gnd, with the exception that current is being sourced by source/sink 204. (If external resistor 203 is tied to the power supply voltage and source/sink 204 is attempting to source current, there is no change in the voltage at pin 202; similarly no change in voltage will be detected when source/sink 204 is attempting to sink current and external resistor 203 is tied to ground.)

From the polarity of the current and the current step causing the comparator to trip, finite state machine 205 outputs an N-bit word representing the detected state.

Consider the following example. Assume that the number of modes being decoded is 16 (i.e. modes 0 to 15) and that B=2. Consequently, N is equal to 4 and K will be in the range of 0 to 7 allowing 8 resistor values in the exponential sequence $1 R_0, 2 R_0, \ldots, 128 R_0$. The sinking of current can then be arbitrarily selected as representing Modes 0 to 7 and the sourcing of current as representing Modes 8-15. Hence if Mode 4 is desired, then a resistor having a value of 16 $R_0$ is coupled to $V_{DD}$. Similarly, if Mode 10 is desired, then a resistor having a value of 4 $R_0$ is coupled to ground.

In sum, to program a single pin to an N-bit value, the user need only select the value of resistor 203 from the set of $B^K$ possible values. Advantageously, because the resistive values are exponentially distributed, the resistor tolerances can be relaxed. Moreover, the tolerances on all analog components used to implement the current sources and sinks described above can also be relaxed. In other words, mismatch tolerance is independent of the number of modes supported. Moreover, if M number of pins on device 100 are each provided with static programming circuitry 104, then device 100 can be configured to one of $2^{(M N)}$ nodes rather than only $2^M$ modes.

Figure 3:
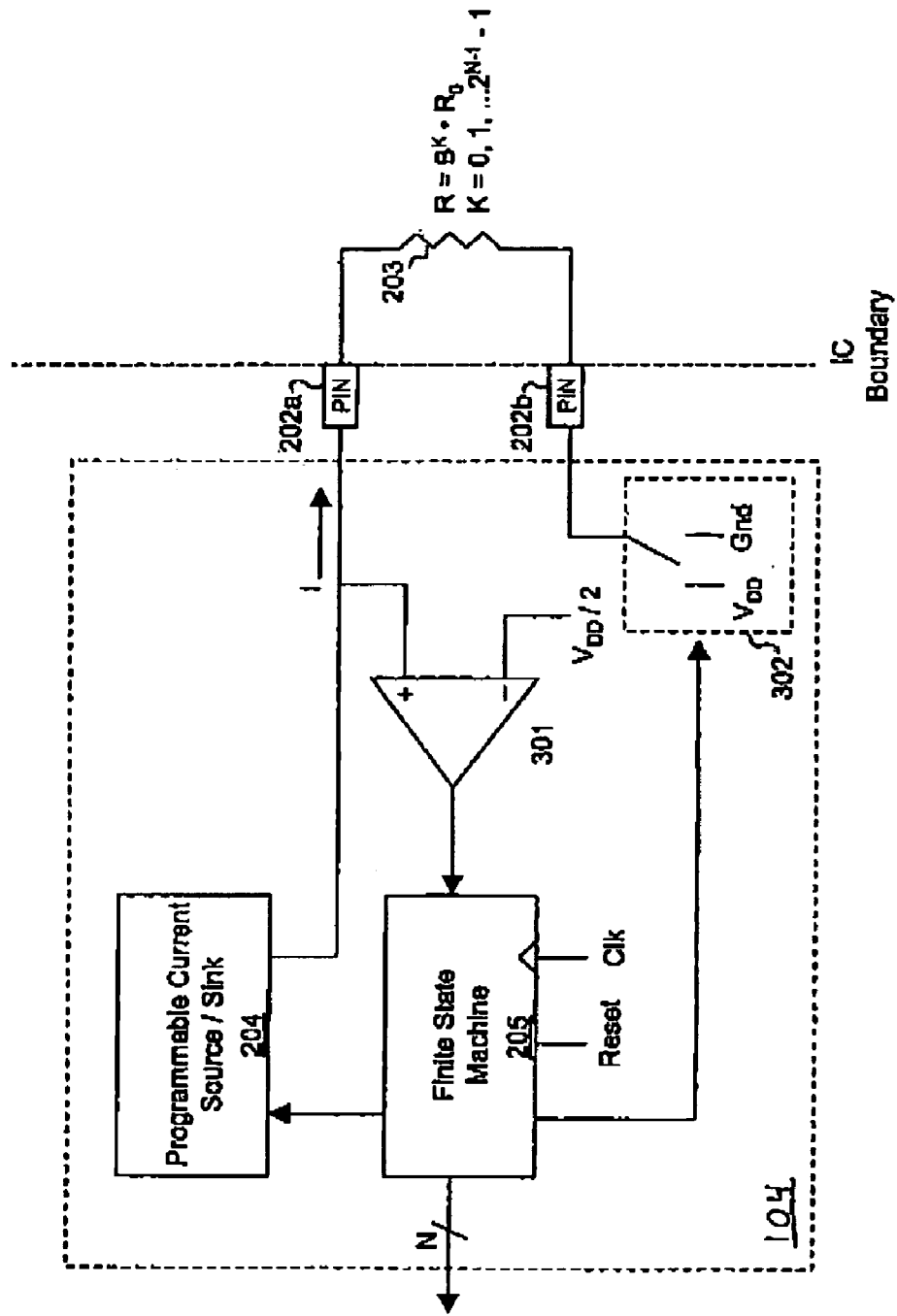
FIG. 3 illustrates an alternate embodiment in which the external programming resistor is coupled between a pair of pins.

FIG. 3 illustrates an alternate embodiment in which external resistor 203 is coupled between a pair of pins 202a,b. In this case, a differential comparator 301 is used to measure the voltage difference between pins as current is switched through the external resistor. This switching can be implemented using a simple switch 302 under the control of finite state machine 205. Depending on magnitude and polarity of the voltage, the resistance value can be decoded to determine the programmed mode.

Figure 4A:
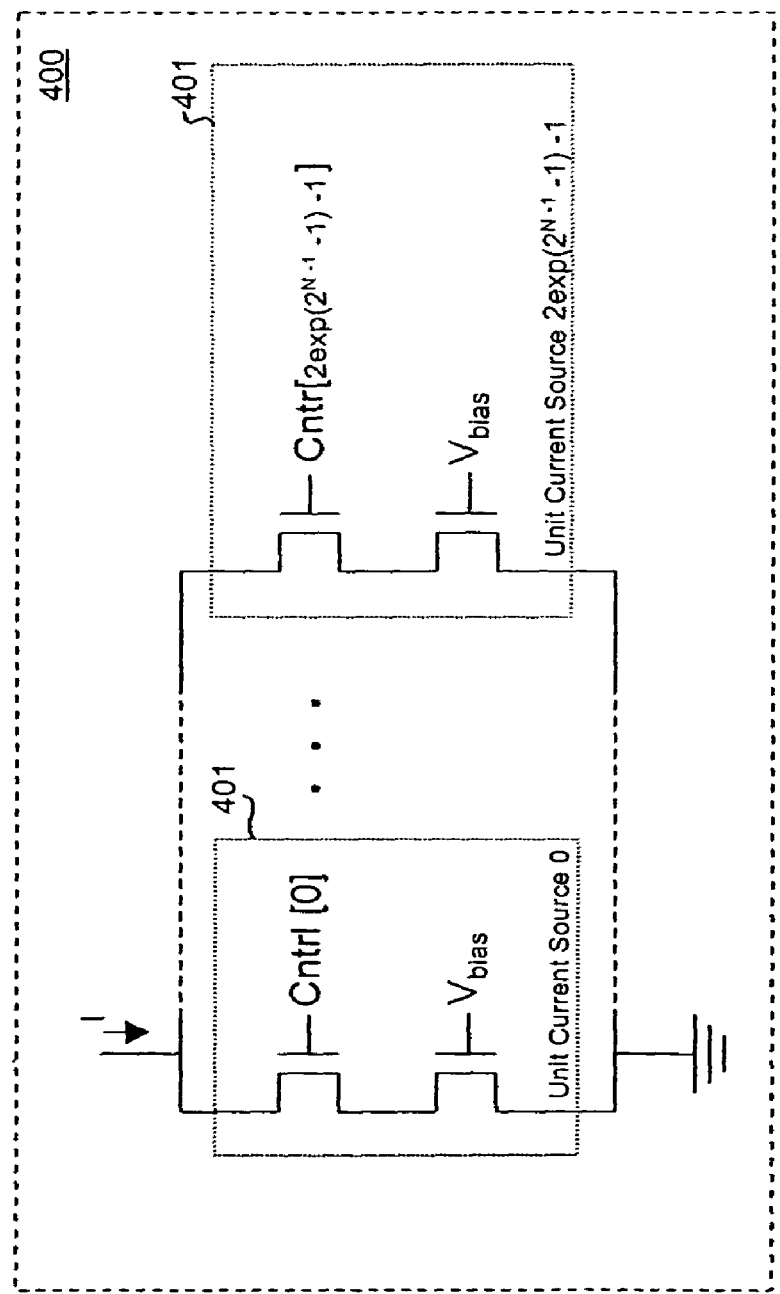
FIG. 4A depicts one circuit which can be used to implement the programmable current source/sink block of FIGS. 2 and 3.

There are a number of circuits which can be used to implement programmable current source/sink block 204. One such circuit 400 is shown in FIG. 4A for the case of B=2. In this case, the binary weighted source currents are generated by sequentially turning-on 2 raised to the power of $(2^{N-1}-1)$ unit current sources 401 in response to corresponding control signals CNTRL[X]. A unity gain current mirror can then be used to turn the source current into a sink current.

Figure 4B:
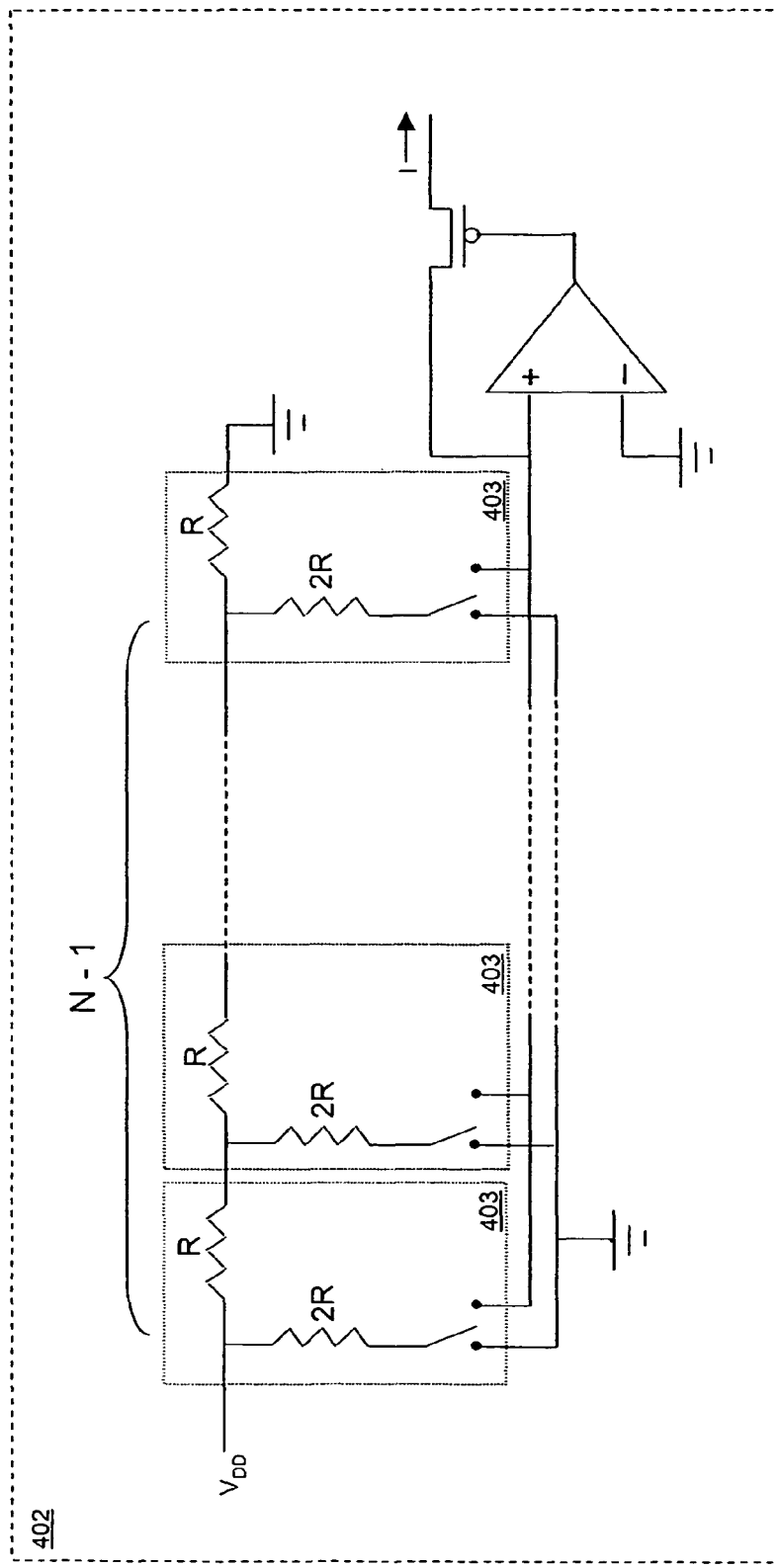
FIG. 4B illustrates a second circuit, which can be used to implement the programmable current source/sink block of FIGS. 2 and 3.

A second circuit 402 for generating binary weighted currents is shown in FIG. 4B. This embodiment is based on a resistive ladder of N−1 number R−2R resistive units 403.

Although the invention has been described with reference to specific embodiments, these descriptions are not meant to be construed in a limiting sense. Various modifications of the disclosed embodiments, as well as alternative embodiments of the invention, will become apparent to persons skilled in the art upon reference to the description of the invention. It should be appreciated by those skilled in the art that the conception and the specific embodiment disclosed might be readily utilized as a basis for modifying or designing other structures for carrying out the same purposes of the present invention. It should also be realized by those skilled in the art that such equivalent constructions do not depart from the spirit and scope of the invention as set forth in the appended claims.

It is therefore contemplated that the claims will cover any such modifications or embodiments that fall within the true scope of the invention.

What is claimed is:

1. An integrated circuit comprising:
   a terminal for coupling to a resistor having a resistance value assigned to one of a plurality of different non-zero finite resistance values, wherein each different resistance value corresponds to a different operating mode of the integrated circuit and the different resistance values differ from each other based on a geometric progression of resistance values in accordance with the equation:

Resistance=$B^K R_0$ in which K is selected from the set K=0, 1, 2, ..., $2^{(N-1)}-1$, B is a numerical factor having a non-zero finite value and selected such that the value $B^K R_0$ is finite $R_0$ is a selected base resistance having a non-zero finite value, and N is an integer value greater than 2;
   circuitry on the integrated circuit operable in the corresponding one of the modes in response to one of the resistance values presented by a resistor coupled to the terminal;
   circuitry measuring the resistance value of the resistor coupled to the terminal;
   based on the measured resistance value of the resistor, setting the integrated circuit into the corresponding one of the different operating modes;
   wherein the circuitry for measuring the resistance value of the resistor coupled to the terminal is operable to source current through the terminal when the resistor is coupled in series between the terminal and ground; and
   wherein the circuitry for measuring the resistance value of the resistor coupled to the terminal is operable to sink current through the terminal when the resistor is coupled in series between the terminal and a voltage supply.

\* \* \* \* \*